US010524060B2

United States Patent
Wu et al.

(10) Patent No.: US 10,524,060 B2
(45) Date of Patent: Dec. 31, 2019

(54) MEMS DEVICE HAVING NOVEL AIR FLOW RESTRICTOR

(71) Applicants: Guanghua Wu, Dublin, CA (US); Xingshuo Lan, San Jose, CA (US)

(72) Inventors: Guanghua Wu, Dublin, CA (US); Xingshuo Lan, San Jose, CA (US)

(73) Assignee: GMEMS Technologies International Limited, Milpitas, CA (US)

( * ) Notice: Subject to any disclaimer, the term of this patent is extended or adjusted under 35 U.S.C. 154(b) by 0 days.

(21) Appl. No.: 16/000,860

(22) Filed: Jun. 5, 2018

(65) Prior Publication Data

US 2018/0288532 A1   Oct. 4, 2018

Related U.S. Application Data

(63) Continuation-in-part of application No. 15/393,831, filed on Dec. 29, 2016, now Pat. No. 10,171,917.

(51) Int. Cl.
 *H04R 19/04* (2006.01)
 *H04R 19/00* (2006.01)
 *H04R 7/06* (2006.01)

(52) U.S. Cl.
 CPC ...... *H04R 19/04* (2013.01); *B81B 2201/0257* (2013.01); *B81B 2203/0127* (2013.01); *B81B 2203/033* (2013.01); *H04R 7/06* (2013.01); *H04R 19/005* (2013.01); *H04R 2201/003* (2013.01)

(58) Field of Classification Search
 CPC .................. H04R 19/005; H04R 2201/003
 See application file for complete search history.

(56) References Cited

U.S. PATENT DOCUMENTS

| | | | | |
|---|---|---|---|---|
| 6,753,583 | B2* | 6/2004 | Stoffel | G01L 9/0072 257/415 |
| 8,131,006 | B2* | 3/2012 | Martin | H04R 19/005 381/423 |
| 8,165,323 | B2* | 4/2012 | Zhou | H01G 5/011 257/415 |
| 8,755,556 | B2* | 6/2014 | Cohen | B81B 3/0021 381/176 |
| 9,402,137 | B2* | 7/2016 | Hsu | H04R 19/005 |
| 9,611,135 | B1* | 4/2017 | Klein | H02N 2/02 |

* cited by examiner

*Primary Examiner* — Curtis A Kuntz
*Assistant Examiner* — Ryan Robinson
(74) *Attorney, Agent, or Firm* — Guosheng Wang; United States Research and Patent Firm (57) ABSTRACT

The present invention provides a MEMS device such as a capacitive MEMS microphone that comprises a new design of air flow restrictor. An air channel includes a first internal wall and a second internal wall for air to flow between. A trench is recessed from the first internal wall, and an insert is extended from the second internal wall and inserted into the trench. The spatial relationship between the insert and the trench can vary or oscillate. Air resistance of the channel may be controlled by the trench depth. The air resistance is higher with a deeper trench. The invention has a significant effect on, for example, keeping the sound frequency response plot more flat on the low frequency part ranging from 20 Hz to 1000 Hz.

17 Claims, 14 Drawing Sheets

(Prior Art)

Cross Section View

Top View

MEMS DEVICE HAVING NOVEL AIR FLOW RESTRICTOR

CROSS-REFERENCE TO RELATED U.S. APPLICATIONS

This application is a Continuation-in-Part of U.S. non-provisional application Ser. No. 15/393,831, filed on Dec. 29, 2016, which is incorporated herein in its entirety by reference.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention generally relates to a MEMS device having a new design of air flow restrictor, such as a lateral mode capacitive microphone. The microphone of the invention may find applications in smart phones, telephones, hearing aids, public address systems for concert halls and public events, motion picture production, live and recorded audio engineering, two-way radios, megaphones, radio and television broadcasting, and in computers for recording voice, speech recognition, VoIP, and for non-acoustic purposes such as ultrasonic sensors or knock sensors, among others.

BACKGROUND OF THE INVENTION

A microelectromechanical system (MEMS) is a microscopic device with moving parts that is fabricated in the same general manner as integrated circuits. For example, a MEMS microphone is a transducer that converts sound into an electrical signal. Among different designs of microphone, a capacitive microphone or a condenser microphone is conventionally constructed employing the so-called "parallel-plate" capacitive design. Unlike other microphone types that require the sound wave to do more work, only a very small mass in capacitive microphones needs be moved by the incident sound wave. Capacitive microphones generally produce a high-quality audio signal and are now the popular choice in consumer electronics, laboratory and recording studio applications, ranging from telephone transmitters through inexpensive karaoke microphones to high-fidelity recording microphones.

Figure 1A:
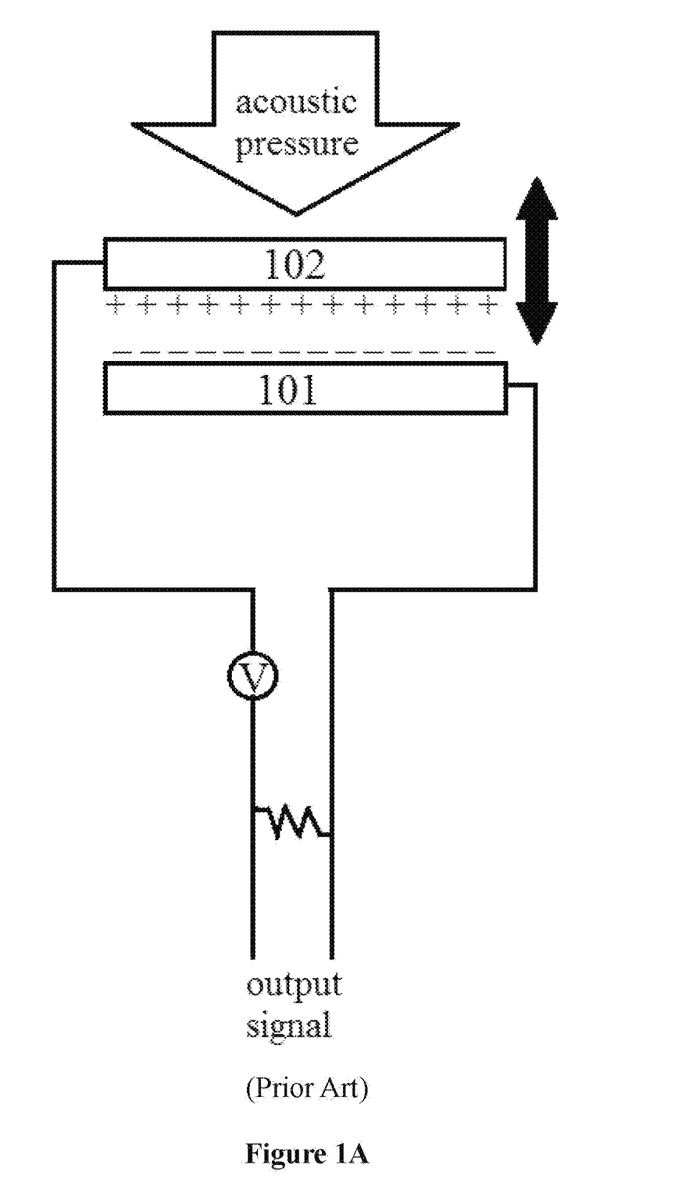
FIG. 1A schematically illustrates a conventional capacitive microphone in the prior art.

FIG. 1A is a schematic diagram of parallel capacitive microphone in the prior art. Two thin layers 101 and 102 are placed closely in almost parallel. One of them is fixed backplate 101, and the other one is movable/deflectable membrane/diaphragm 102, which can be moved or driven by sound pressure. Diaphragm 102 acts as one plate of a capacitor, and the vibrations thereof produce changes in the distance between two layers 101 and 102, and changes in the mutual capacitance therebetween.

"Squeeze film" and "squeezed film" refer to a type of hydraulic or pneumatic damper for damping vibratory motion of a moving component with respect to a fixed component. Squeezed film damping occurs when the moving component is moving perpendicular and in close proximity to the surface of the fixed component (e.g., between approximately 2 and 50 micrometers). The squeezed film effect results from compressing and expanding the fluid (e.g., a gas or liquid) trapped in the space between the moving plate and the solid surface. The fluid has a high resistance, and damps the motion of the moving component as the fluid flows through the space between the moving plate and the solid surface.

In capacitive microphones as shown in FIG. 1A, squeeze film damping occurs when two layers 101 and 102 are in close proximity to each other with air disposed between them. The layers 101 and 102 are positioned so close together (e.g. within 5 μm) that air can be "squeezed" and "stretched" to slow movement of membrane/diaphragm 101. As the gap between layers 101 and 102 shrinks, air must flow out of that region. The flow viscosity of air, therefore, gives rise to a force that resists the motion of moving membrane/diaphragm 101. Squeeze film damping is significant when membrane/diaphragm 101 has a large surface area to gap length ratio. Such squeeze film damping between the two layers 101 and 102 becomes a mechanical noise source, which is the dominating factor among all noise sources in the entire microphone structure.

Figure 1B:
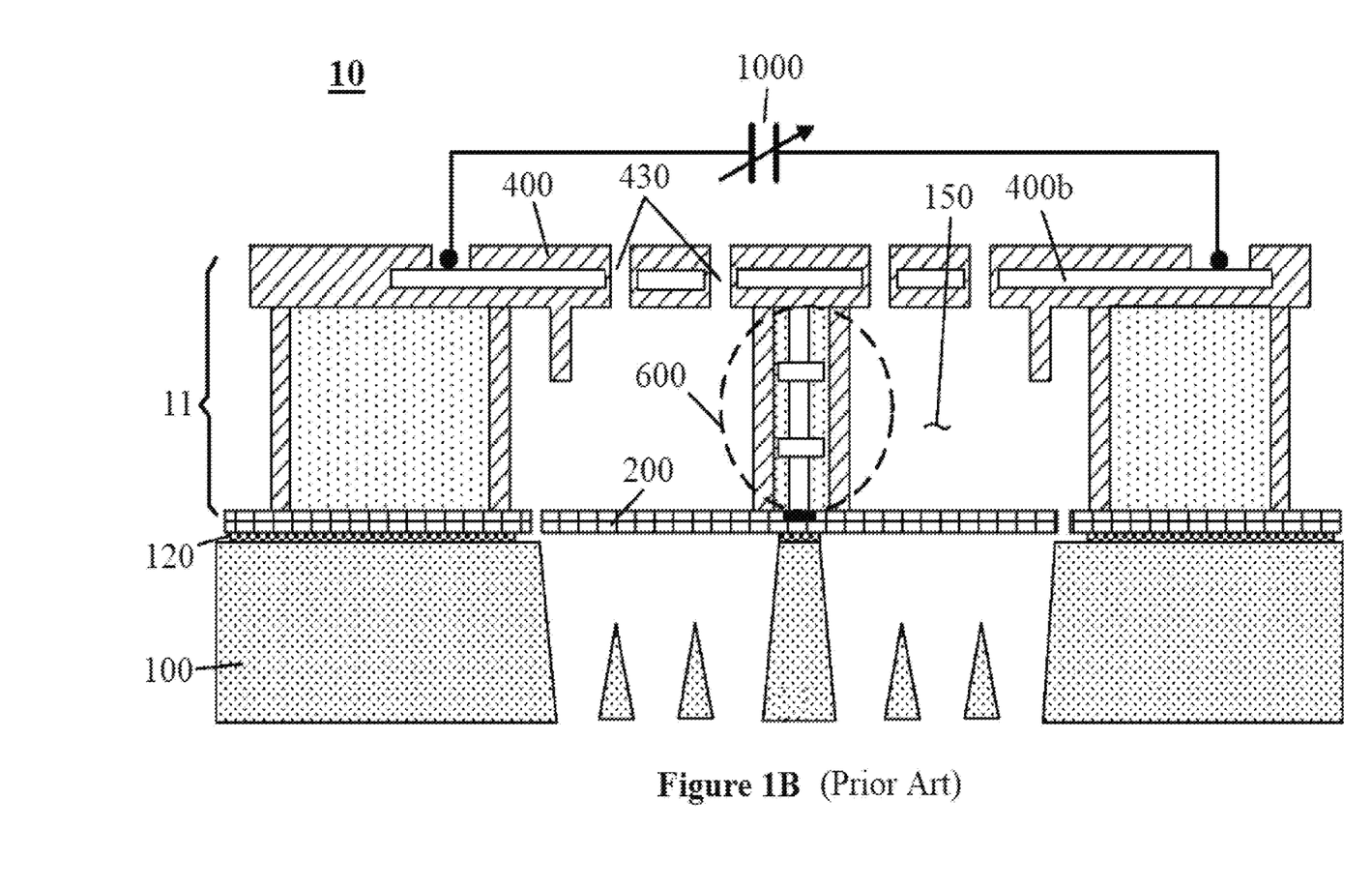
FIG. 1B shows a conventional capacitive microphone with a perforated backplate in the prior art.

Perforation of backplate has been employed to control the squeeze film damping to a desired range. For example, US Patent Application 2014/0299948 by Wang et al. discloses a silicon based MEMS microphone as shown in FIG. 1B. Microphone 10 may receive an acoustic signal and transform the received acoustic signal into an electrical signal for the subsequent processing and output. Microphone 10 includes a silicon substrate 100 and an acoustic sensing part 11 supported on the silicon substrate 100 with an isolating oxide layer 120 sandwiched in between. The acoustic sensing part 11 of the microphone 10 may include at least: a conductive and compliant diaphragm 200, a perforated backplate 400, and an air gap 150. The diaphragm 200 is formed with a part of a silicon device layer such as the top-silicon film on a silicon-on-insulator (SOI) wafer or with polycrystalline silicon (Poly-Si) membrane through a deposition process. The perforated backplate 400 is located above the diaphragm 200, and formed with CMOS passivation layers with a metal layer 400b imbedded therein which serves as an electrode plate of the backplate 400. The air gap 150 is formed between the diaphragm 200 and the backplate 400. The conductive and compliant diaphragm 200 serves as a vibration membrane which vibrates in response to an external acoustic wave reaching the diaphragm 200 from the outside, as well as an electrode. The backplate 400 provides another electrode of the acoustic sensing part 11, and has a plurality of through holes 430 formed thereon, which are used for air ventilation so as to reduce air damping that the diaphragm 200 will encounter when starts vibrating. Therefore, the diaphragm 200 is used as an electrode plate to form a variable condenser 1000 with the electrode plate of the backplate 400. The acoustic sensing part 11 of the microphone 10 may further include an interconnection column 600 provided between the center of the diaphragm 200 and the center of the backplate 400 for mechanically suspending and electrically wiring out the diaphragm 200 using CMOS metal interconnection method, and the periphery of the diaphragm 200 is free to vibrate.

This structure typically contains a series of tiny holes or tiny slots, for example, on the edge of diaphragm, in order to control the resistance of air flow in a desired level. This air flow is between the two sides of diaphragm and is also called air leakage. When the air leakage rate is too low, the air pressure on the two sides of the diaphragm might be unbalanced. Consequently, a sudden air pressure change or a sudden acceleration of the microphone may cause a sudden motion of moving membrane/diaphragm 101, which may damage the delicate membrane/diaphragm 101. When the air leakage rate is too high, the microphone may have a descending sensitivity response on low frequency audio. Advantageously, the present invention provides a solution to such a problem with a new design of air flow restrictor, in which the air leakage is controlled to a desired range, i.e. not too high and not too low.

SUMMARY OF THE INVENTION

The present invention provides a MEMS device comprising a channel for air to flow through. The channel may be defined by at least a first internal wall and a second internal wall, and air flows between the two walls. While a trench is recessed from the first internal wall, an insert is extended from the second internal wall and inserted into the trench. The insert and the trench have a relative spatial relationship therebetween, and the spatial relationship varies with a frequency F1, which can be any value greater than 0.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

Figure 1C:
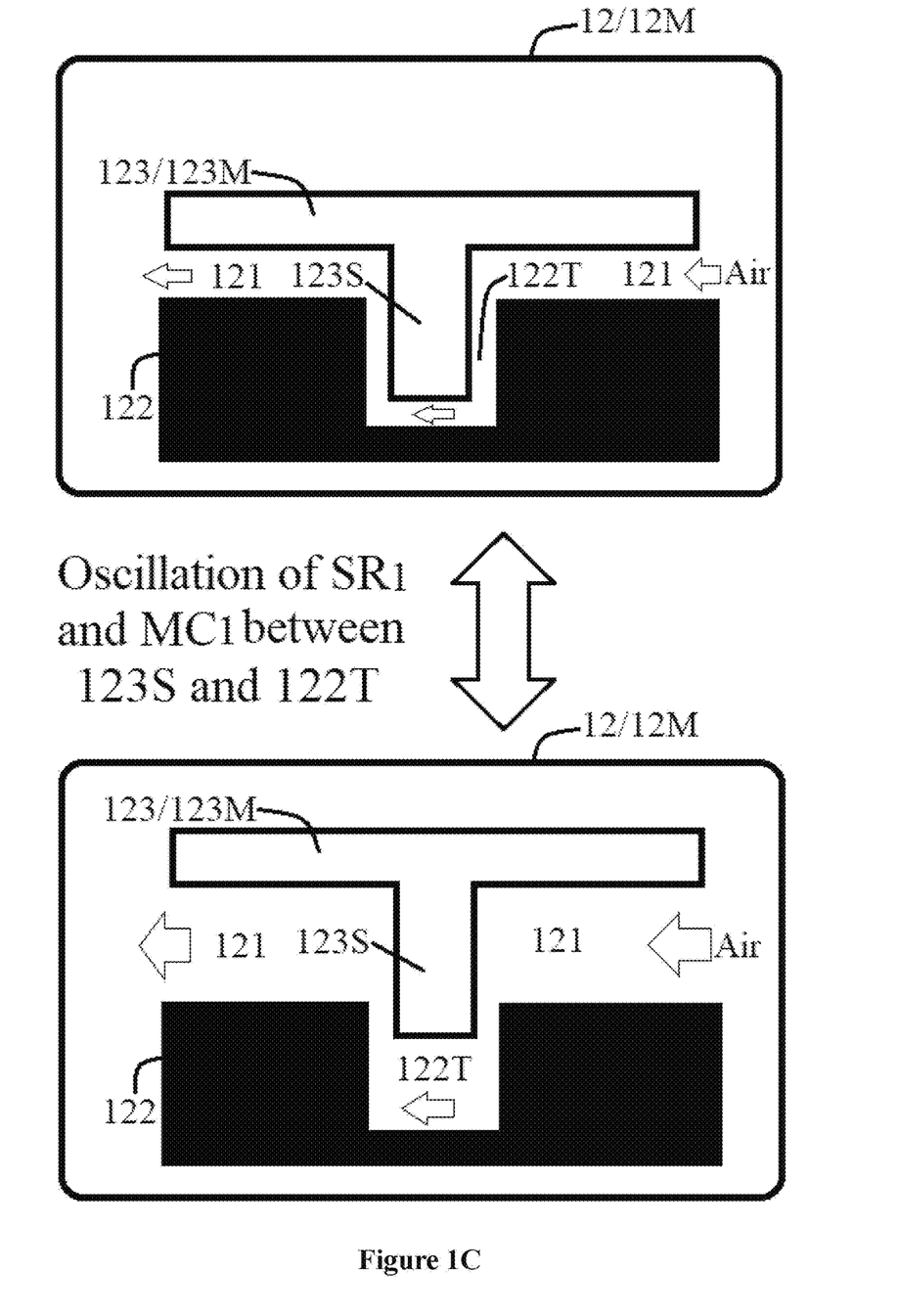
FIG. 1C illustrates a MEMS device having a new design of air flow restrictor in accordance with an exemplary embodiment of the present invention.

With reference to FIG. 1C, a MEMS device 12 includes a channel 121 for air to flow through. Channel 121 is defined by at least a first internal wall 122 and a second internal wall 123. Air (shown as arrows) can flow between the first internal wall 122 and the second internal wall 123. A trench 122T is recessed from the first internal wall 122. An insert 123S is extended from the second internal wall 123 and inserted into the trench 122T, but does not completely fill the trench 122T so that air can still flow between 122T and 123S. Air resistance of the channel 121 may be controlled by the depth of trench 122T. The air resistance is higher with a deeper trench 122T. In preferred embodiments, both walls 122 and 123 have a flat surface, trench 122T is perpendicular to the flat surface of the first internal wall 122, and insert 123S is perpendicular to the flat surface of the second internal wall 123.

The insert 123S and the trench 122T have a first relative spatial relationship (SR1) between them, and such spatial relationship (SR1) varies (or fluctuates or oscillates) with a frequency F1 that can be any value greater than zero. FIG. 1C shows the insert 123S and the trench 122T move toward, and away from, each other, in an exaggerated way for a microphone. In some embodiments, a first mutual capacitance (MC1) can exist between the insert 123S and the trench 122T, and the first mutual capacitance (MC1) varies (or fluctuates or oscillates) as well, for example, varies (or fluctuates or oscillates) in a frequency F2 that can be any value greater than zero. In preferred embodiments, F1 and F2 are independently of each other in the range of from 20 Hz to 20,000 Hz, when MEMS device 12 such as a microphone is in working/operating status or state. In a more preferred embodiment, F1=F2.

In some embodiments, the first internal wall 122 is at least partially made of a substrate, or it is a part of a substrate, and the substrate may be for example a substrate for a semiconductor device or a MEMS device. The second internal wall 123 may be a movable membrane 123M. The insert 123S moves along with the movable membrane 123M when the movable membrane 123M moves. In preferred embodiments, the MEMS device 12 is a capacitive MEMS microphone 12M. The microphone 12M is configured to detect acoustic wave with frequency F3. For example, the sound wave may cause a variation (or fluctuation or oscillation) of both the relative spatial relationship (SR1) and the mutual capacitance (MC1) between the insert 123S and the trench 122T, in a manner that F=F2=F3.

Figure 2A:
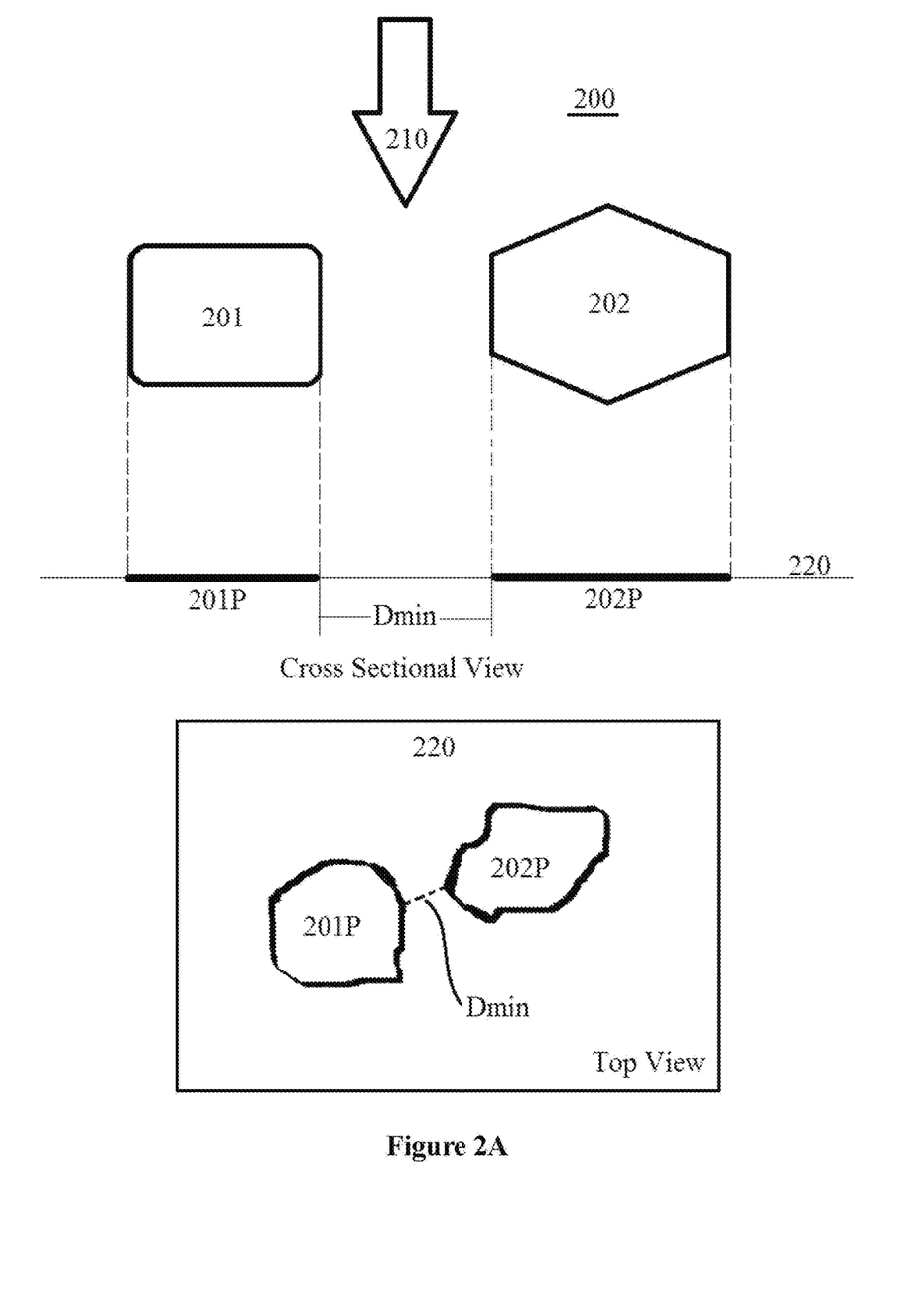
FIG. 2A schematically shows a lateral mode capacitive microphone in accordance with an exemplary embodiment of the present invention.
Figure 3:
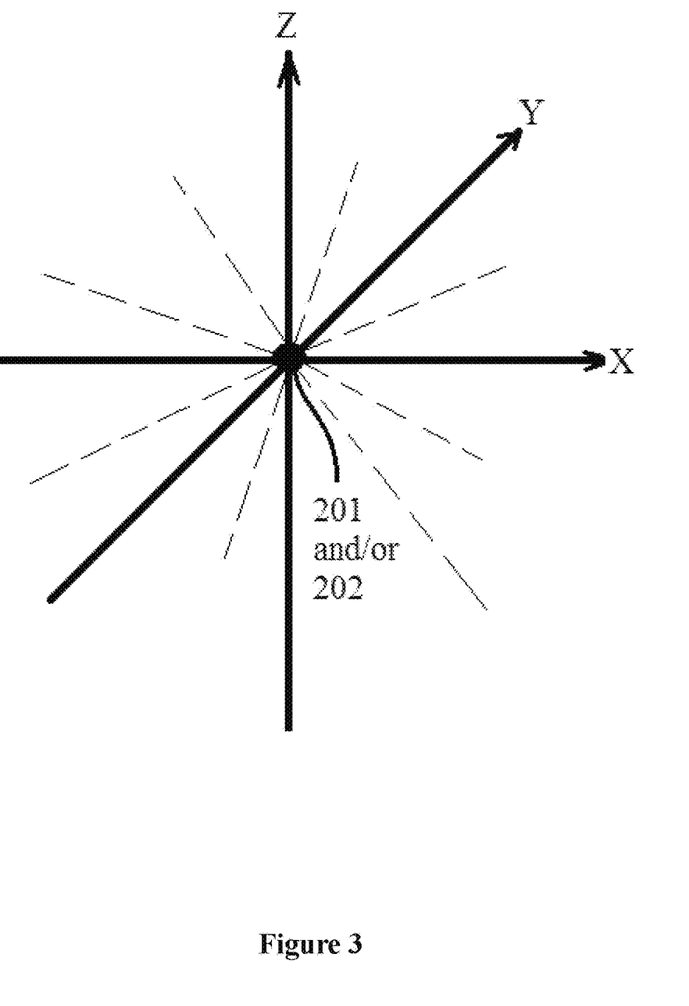
FIG. 3 illustrates acoustic pressures impacting a microphone along a range of directions.
Figure 4:
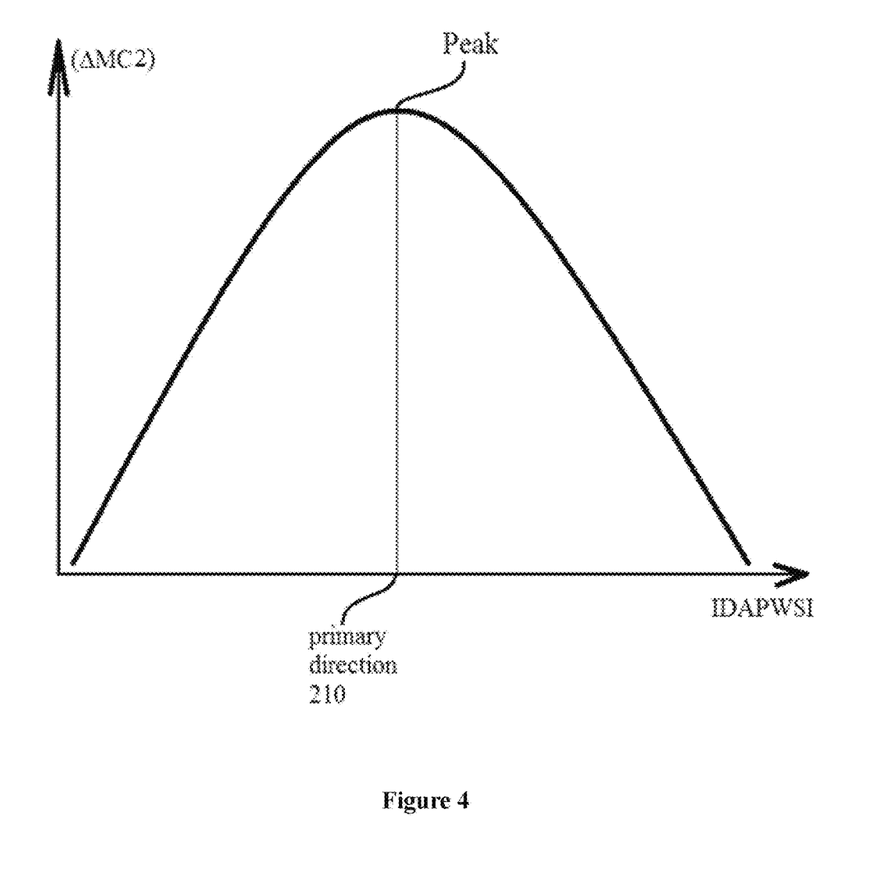
FIG. 4 illustrates the methodology on how to determine the primary direction for the internal components in a microphone in accordance with an exemplary embodiment of the present invention.

In a variety of exemplary embodiments, MEMS device 12 as shown in FIG. 1C is a capacitive microphone comprising a first electrical conductor and a second electrical conductor. The two conductors are configured to have a second relative spatial relationship (SR2) therebetween so that a second mutual capacitance (MC2) can exist between them. The relative spatial relationship (SR2) as well as the mutual capacitance (MC2) can both be varied or oscillated by an acoustic pressure impacting upon the first electrical conductor and/or the second electrical conductor along a range of impacting directions in 3D space. Given the same strength/intensity of acoustic pressure, the mutual capacitance (MC2) can be varied or oscillated the most (or maximally varied/oscillated) by an acoustic pressure impacting upon the first electrical conductor and/or the second electrical conductor along one direction among the above range of impacting directions. Such a direction is defined as the primary direction. The first electrical conductor has a first projection along the primary direction on a conceptual plane that is perpendicular to the primary direction. The second electrical conductor has a second projection along the primary direction on the conceptual plane. The first projection and the second projection have a shortest distance Dmin therebetween, and Dmin remains greater than zero regardless the first electrical conductor and/or the second electrical conductor is (are) impacted by an acoustic pressure along the primary direction or not. In an embodiment, With reference to FIG. 2A for more details. In a capacitive microphone 200 such as a MEMS microphone, a first electrical conductor 201 and a second electrical conductor 202 are configured to have a relative spatial relationship (SR2) therebetween so that a mutual capacitance (MC2) can exist between them. The movable membrane 123M may constitute at least a part of the second electrical conductor 202 (including the entire second electrical conductor 202). The first electrical conductor 201 and the second electrical conductor 202 are independently of each other made of polysilicon, gold, silver, nickel, aluminum, copper, chromium, titanium, tungsten, and platinum. The relative spatial relationship (SR2) as well as the mutual capacitance (MC2) can both be varied or oscillated by an acoustic pressure impacting upon the first electrical conductor 201 and/or the second electrical conductor 202. As shown in FIG. 3, the acoustic pressure may impact 201 and/or 202 along a range of impacting directions in 3D space as represented by dotted lines. Given the same strength/intensity of acoustic pressure, the mutual capacitance (MC2) can be varied/oscillated the most (or maximally varied) by an acoustic pressure impacting upon the first electrical conductor 201 and/or the second electrical conductor 202 along a certain direction among the above range of impacting directions as shown in FIG. 3. The variation of the second mutual capacitance (ΔMC or ΔMC2) caused by various impacting directions of acoustic pressure from 3D space with same intensity (IDAPWSI) is conceptually plotted in FIG. 4. A primary direction is defined as the impacting direction that generates the peak value of ΔMC (or ΔMC2), and is labeled as direction 210 in FIG. 2A. It should be appreciated that, given the same strength/intensity of acoustic pressure, the relative spatial relationship (SR2) can be varied the most (or maximally varied) by an acoustic pressure impacting upon the first electrical conductor 201 and/or the second electrical conductor 202 along a certain direction X among the range of impacting directions as shown in FIG. 3. Direction X may be the same as, or different from, the primary direction 210 as defined above. In some embodiments of the invention, the primary direction may be alternatively defined as the direction X.

Figure 2B:
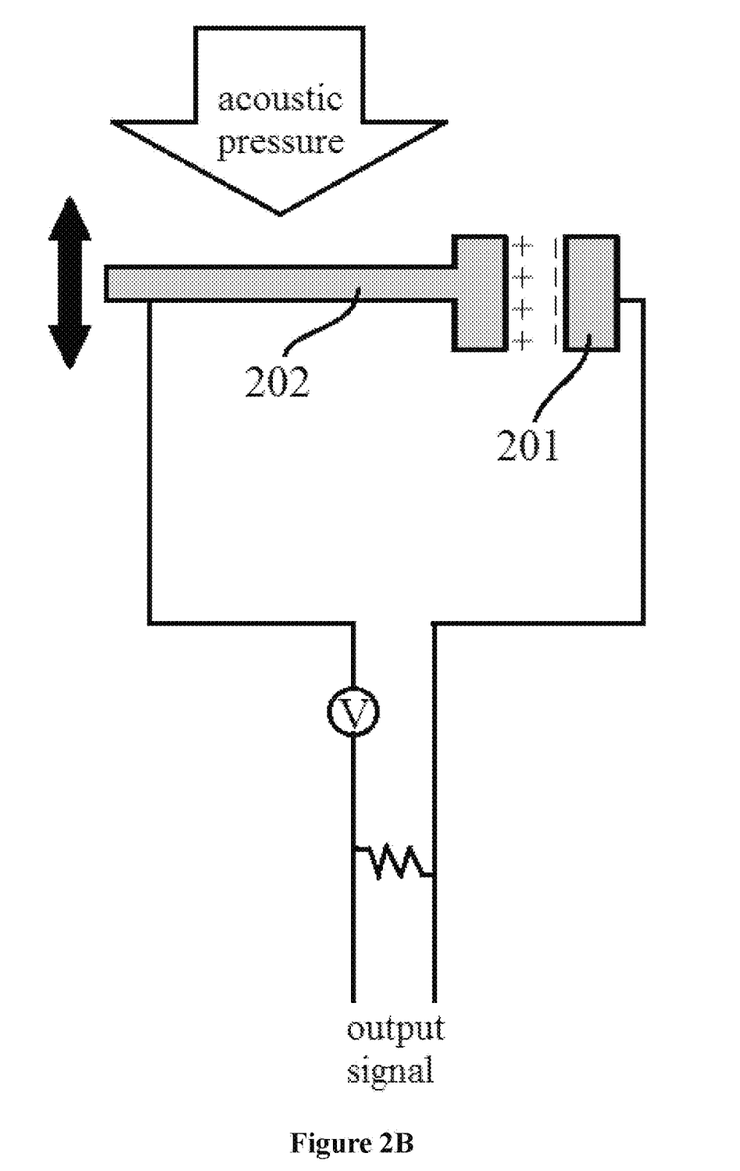
FIG. 2B illustrates a lateral mode capacitive microphone in accordance with an exemplary embodiment of the present invention.

Referring back to FIG. 2A, the first electrical conductor 201 has a first projection 201P along the primary direction 210 on a conceptual plane 220 that is perpendicular to the primary direction 210. The second electrical conductor 202 has a second projection 202P along the primary direction 210 on the conceptual plan 220e. The first projection 201P and the second projection 202P have a shortest distance Dmin therebetween. In the present invention, Dmin may be constant or variable, but it is always greater than zero, no matter the first electrical conductor 201 and/or the second electrical conductor 202 is (are) impacted by an acoustic pressure along the primary direction 210 or not. FIG. 2B illustrates an exemplary embodiment of the microphone of FIG. 2A. First electrical conductor 201 is stationary, and has a function similar to the fixed backplate in the prior art. A large flat area of second electrical conductor 202 including membrane 123M as shown in FIG. 1C, similar to movable/deflectable membrane/diaphragm 102 in FIG. 1A, receives acoustic pressure and moves up and down along the primary direction, which is perpendicular to the flat area. In an embodiment, the entire second electrical conductor 202 or the entire membrane 123M (including the central part thereof) moves up along the primary direction or the normal direction of membrane 123M, and then the entire second electrical conductor 202 or the entire membrane 123M (including the central part thereof) moves down along the primary direction or the normal direction of membrane 123M, in a repeated manner. However, conductors 201 and 202 are configured in a side-by-side spatial relationship. As one "plate" of the capacitor, second electrical conductor 202 does not move toward and from first conductor 201. Instead, second conductor 202 laterally moves over, or "glides" over, first conductor 201, producing changes in the overlapped area between 201 and 202, and therefore varying the mutual capacitance (MC2) therebetween. A capacitive microphone based on such a relative movement between conductors 201 and 202 is called lateral mode capacitive microphone in the present invention.

In exemplary embodiments of the invention, the microphone may be a MEMS (microelectromechanical System) microphone, AKA chip/silicon microphone. Typically, a pressure-sensitive diaphragm is etched directly into a silicon wafer by MEMS processing techniques, and is usually accompanied with an integrated preamplifier. For a digital MEMS microphone, it may include built in analog-to-digital converter (ADC) circuits on the same CMOS chip making the chip a digital microphone and so more readily integrated with digital products.

Figure 5:
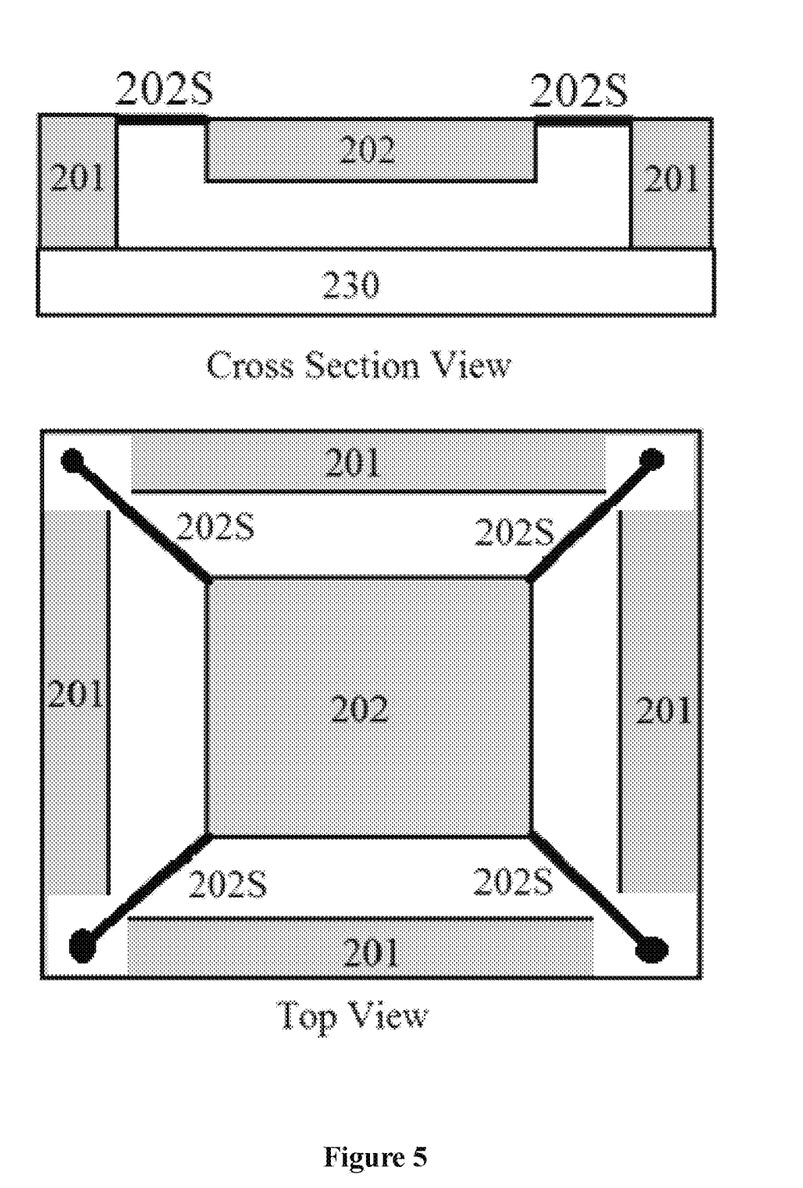
FIG. 5 schematically shows a MEMS capacitive microphone in accordance with an exemplary embodiment of the present invention.

In an embodiment as shown in FIG. 5, capacitive microphone 200 may include a substrate 230 such as silicon, and first internal wall 122 in FIG. 1C is at least partially made of the substrate, or it is a part of the substrate 230. The substrate 230 can be viewed as the conceptual plane 220 in FIG. 2A. The first electrical conductor 201 and the second electrical conductor 202 may be constructed above the substrate 230 side-by-side. Alternatively, first electrical conductor 201 may be surrounding the second electrical conductor 202, as shown in FIG. 5. In an exemplary embodiment, first electrical conductor 201 is fixed relative to the substrate 230. On the other hand, second electrical conductor 202 may be a membrane 123M (or includes a membrane 123M) that is movable relative to the substrate 230. The primary direction may be (is) perpendicular to the membrane plane 202. The movable membrane 202/123M may be attached to the substrate 230 via three or more suspensions 202S such as four suspensions 202S. As will be described and illustrated later, each of the suspensions 202S may comprise folded and symmetrical cantilevers.

Figure 6:
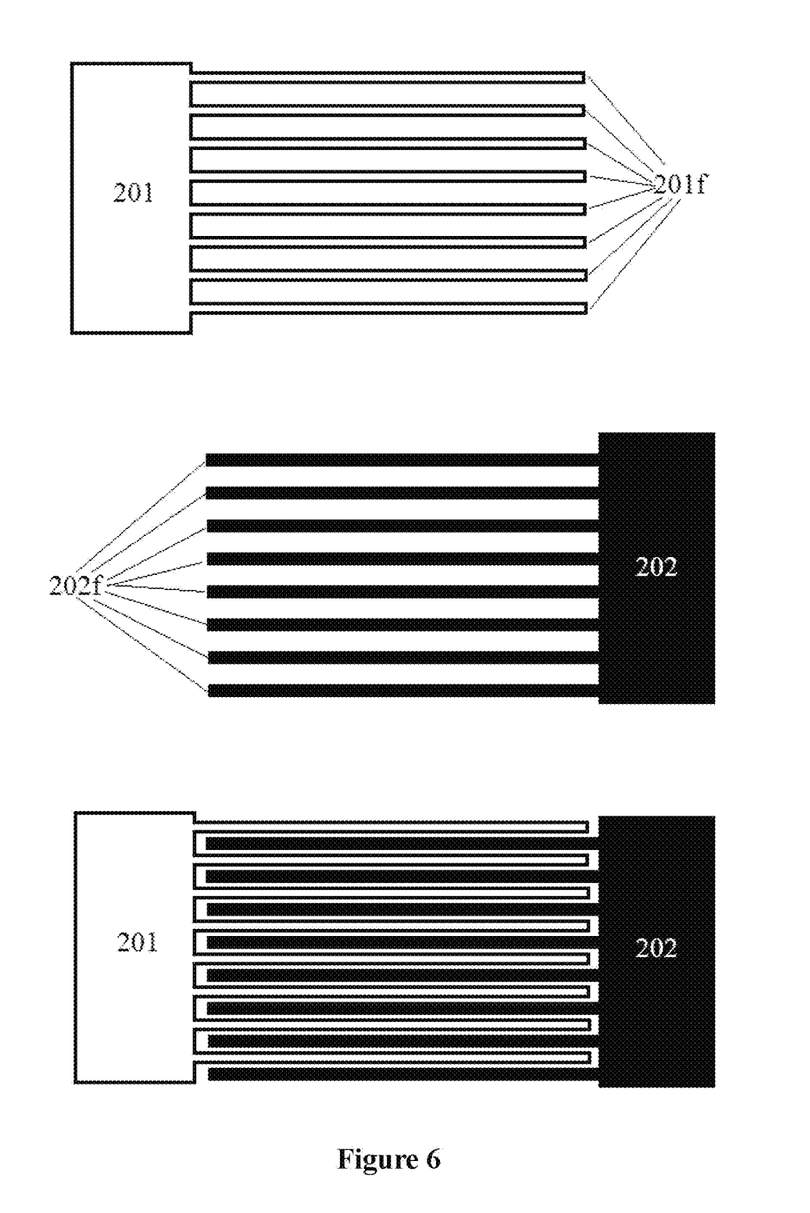
FIG. 6 illustrates the first/second electrical conductors having a comb finger configuration in accordance with an exemplary embodiment of the present invention.
Figure 7:
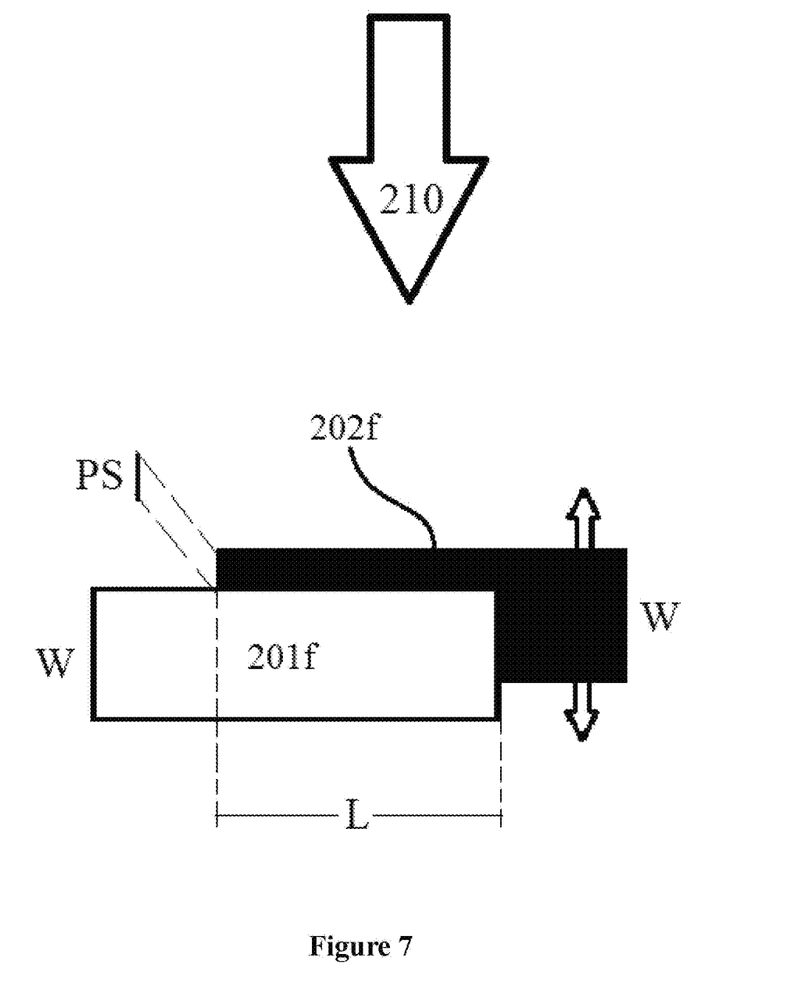
FIG. 7 depicts the spatial relationship between two comb fingers of FIG. 6 in accordance with an exemplary embodiment of the present invention.

In an embodiment as shown in FIG. 6, the first electrical conductor 201 comprises a first set of comb fingers 201f. The movable membrane 123M (second conductor 202) comprises a second set of comb fingers 202f around the peripheral region of the membrane. The two sets of comb fingers 201f and 202f are interleaved into each other. The second set of comb fingers 202f are movable along the primary direction, which is perpendicular to the membrane plane 202, relative to the first set of comb fingers 201f. As such, the resistance from air located within the gap between the membrane 202 and the substrate is lowered, for example, 25 times lower squeeze film damping. In a preferred embodiment, the first set of comb fingers 201f and the second set of comb fingers 202f have identical shape and dimension. As shown in FIG. 7, each comb finger has a same width W measured along the primary direction 210, and the first set of comb fingers 201f and the second set of comb fingers 202f may have a positional shift PS (or stationary positional shift PS) along the primary direction 210, in the absence of any vibration caused by sound wave. For example, the positional shift PS along the primary direction 210 may be one third (⅓) of the width W, PS=⅓ W. In other words, the first set of comb fingers 201f and the second set of comb fingers 202f have an overlap of ⅔ W along the primary direction 210, in the absence of any vibration caused by sound wave.

Figure 8:
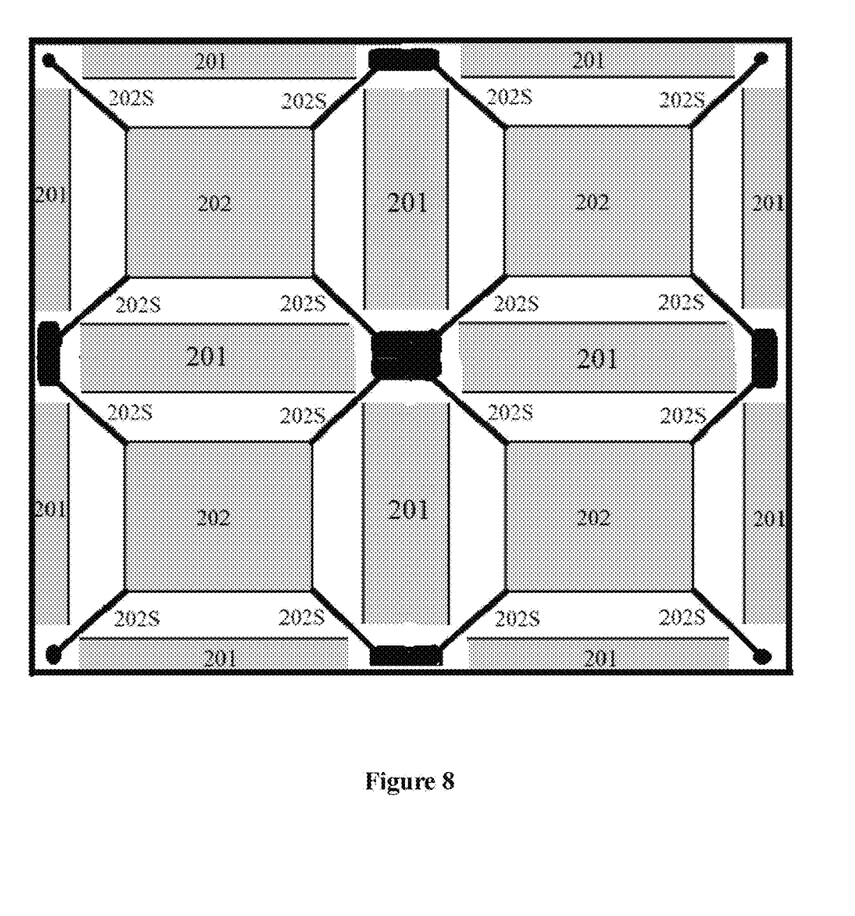
FIG. 8 shows that four movable membranes are arranged in a 2×2 array configuration in accordance with an exemplary embodiment of the present invention.

In embodiments, the movable membrane 202/123M may have a shape of square. As shown in FIG. 8, the capacitive microphone of the invention may include one or more movable membranes. For example, four movable membranes can be arranged in a 2×2 array configuration.

Figure 9:
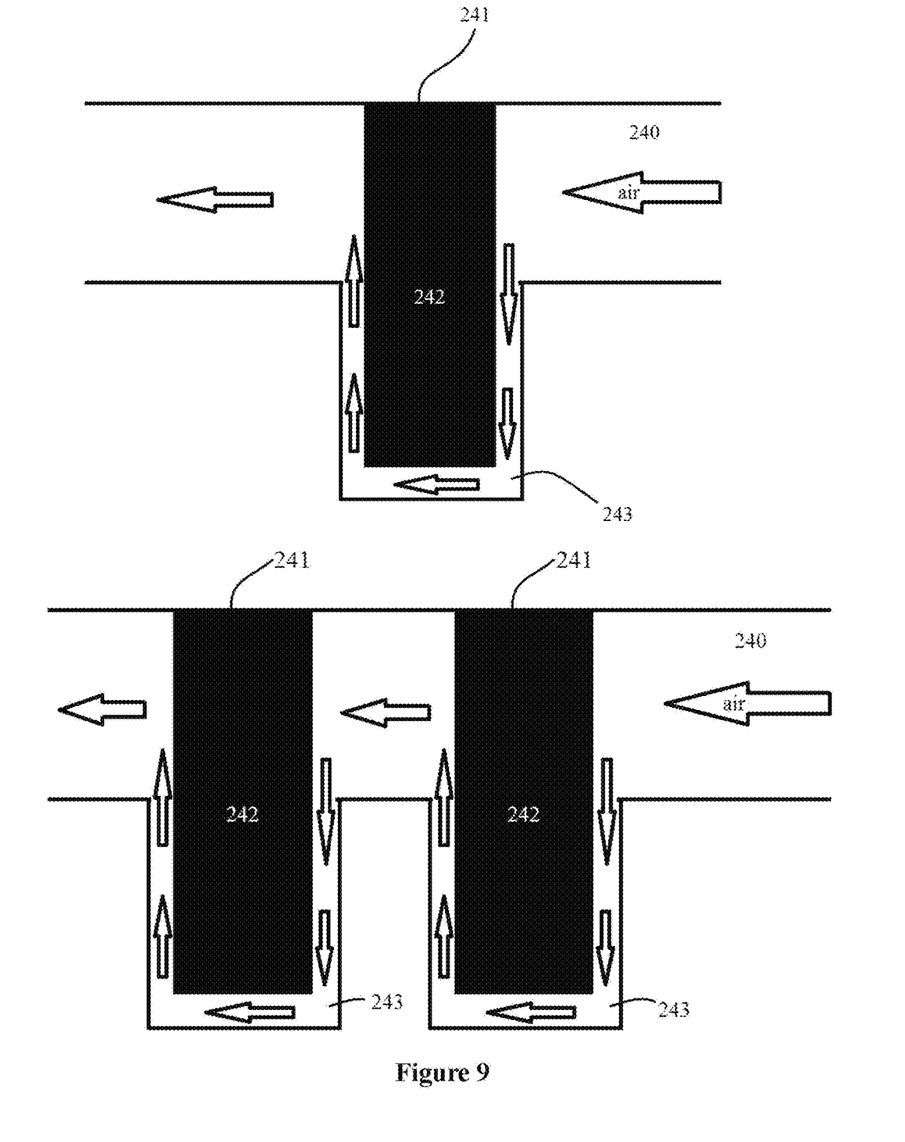
FIG. 9 demonstrates the design of one or more such as two air flow restrictors in accordance with an exemplary embodiment of the present invention.

In some embodiments as shown in FIG. 9, the capacitive microphone of the invention comprises one or more such as two air flow restrictors 241 that restrict the flow rate of air that flows in/out of the gap between the membrane 202/123M and the substrate 230 (or first internal wall 122 as shown in FIG. 1C). Air flow restrictors 241 may be designed to decrease the cross section area (size) of an air channel 240 (or channel 121 as shown in FIG. 1C) for the air to flow in/out of the gap, as compared to a capacitive microphone without such air flow restrictor 241. Alternatively or additionally, air flow restrictors 241 may increase the length of the air channel 240 (or channel 121 as shown in FIG. 1C) for the air to flow in/out of the gap, as compared to a capacitive microphone without such air flow restrictor 241. For example, air flow restrictors 241 may comprise an insert 242 (an example of 123S in FIG. 1C) into a groove 243 (an example of 122T in FIG. 1C), which not only decreases the cross section area of an air channel 240 (or channel 121 as shown in FIG. 1C), but also increases the length of the air channel 240 (or channel 121 as shown in FIG. 1C).

Referring back to FIGS. 6 and 7, comb fingers 201f are fixed on anchor, and comb fingers 202f are integrated with membrane-shaped second electrical conductor 202 (hereinafter membrane 202 or membrane 202/123M, for simplicity). When membrane 202/123M vibrates due to sound wave, fingers 202f move together with membrane 202/123M. The overlap area between two neighboring fingers 201f and 202f changes along with this movement, so does the capacitance MC2. Eventually a capacitance change signal is detected that is the same as conventional capacitive microphone.

Figure 10:
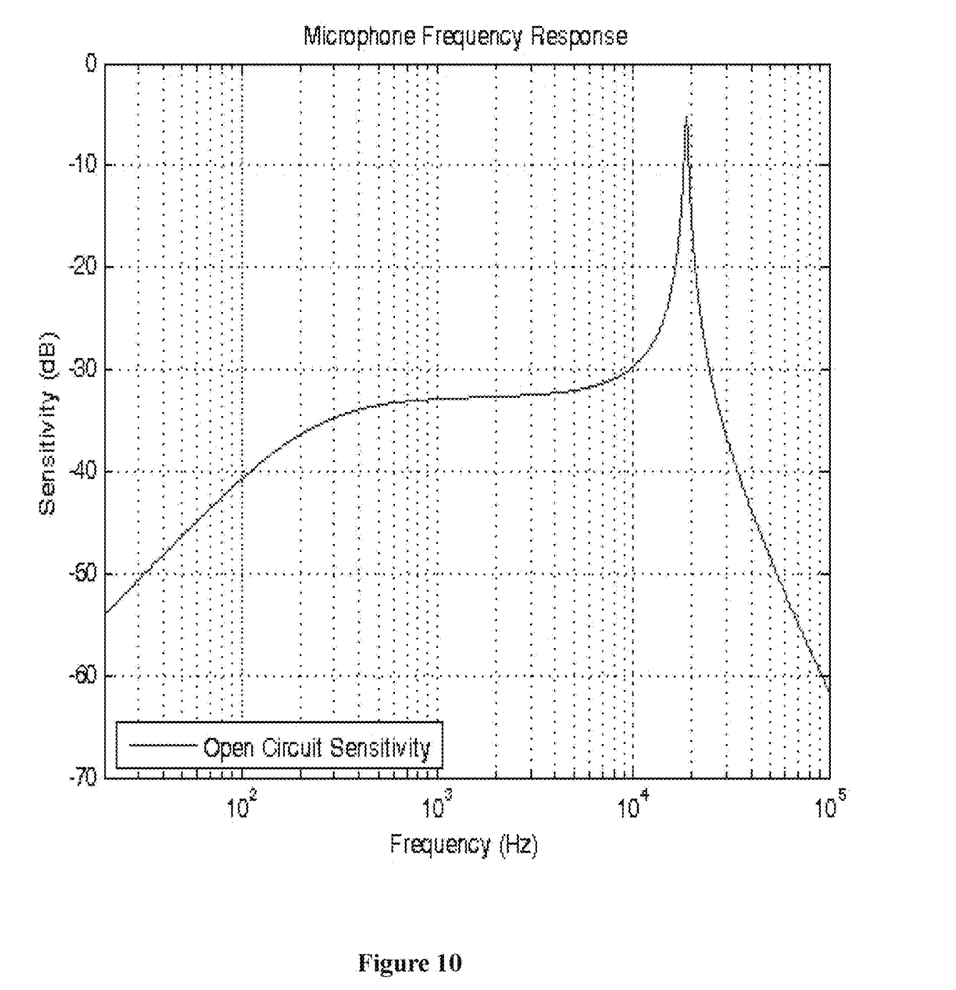
FIG. 10 shows that microphone sensitivity drops at low frequency due to air leakage.

Leakage is always a critical issue in microphone design. In conventional parallel plate design as shown in FIG. 1A, it typically has a couple of tiny holes around the edge in order to let air go through slowly, to keep air pressure balance on both sides of membrane 101 when it experiences undesired vibration or deflection, for example with a frequency of less than 20 Hz. That is a desired leakage. However, a large leakage is undesired, because it will let some low frequency sound wave escape away from membrane vibration easily via the holes, and will result in a sensitivity drop in low frequency, for example around 100 Hz. FIG. 10 shows that sensitivity drops at low frequency due to leakage. For a typical capacitive MEMS microphone, the frequency range is between 20 Hz and 20 kHz, thus the sensitivity drop in FIG. 10 is undesired.

Figure 11:
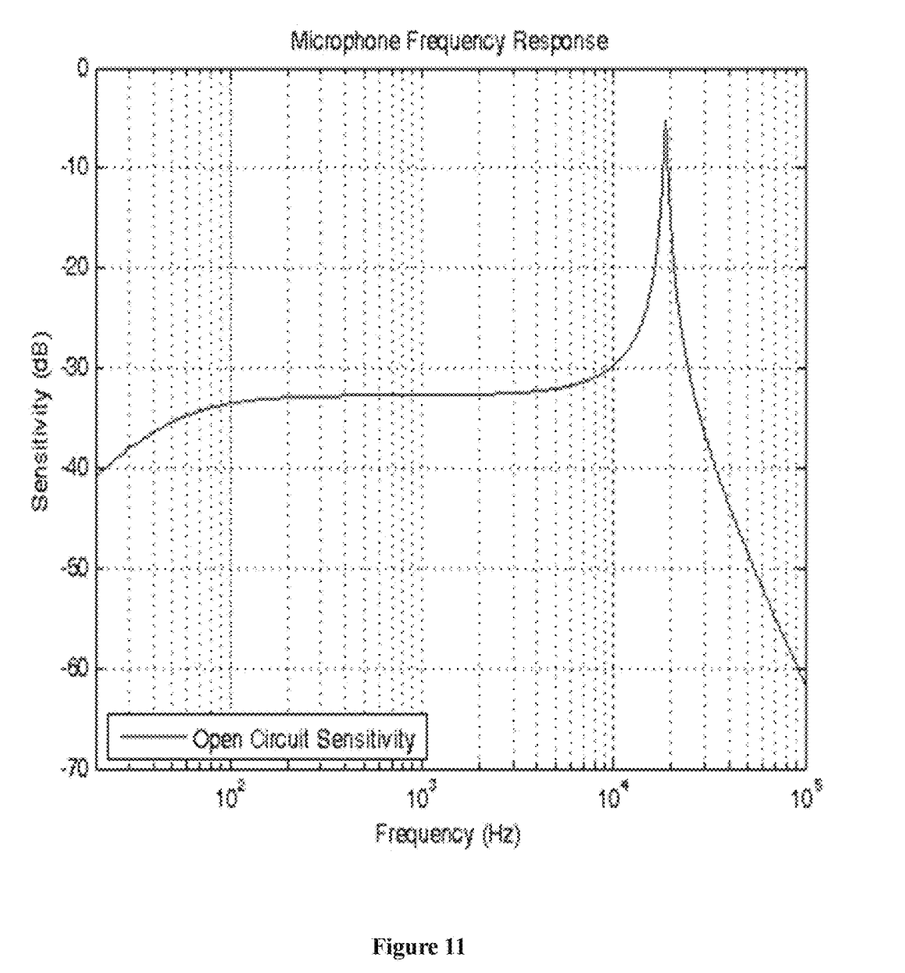
FIG. 11 shows the frequency response with air leakage reduced/prevented in accordance with an exemplary embodiment of the present invention.

In order to prevent this large leakage, a more preferred structure is designed and shown in FIG. 9, which illustrates a leakage prevent groove or slot and wall. Referring back to FIG. 9, air flow restrictors 241 may function as a structure for preventing air leakage in the microphone of the invention. Air flow restrictor 241 comprises an insert 242 into a groove 243, which not only decreases the cross section area (size) of an air channel 240, but also increases the length of the air channel 240. In MEMS microphones, a deep slot may be etched on substrate around the edge of square membrane 202 and then a wall 242 connected to membrane 202 is deposited to form a long and narrow air tube 240, which gives a large acoustic resistance. FIG. 11 depicts the frequency response with leakage prevented. This leakage prevention structure has a significant effect on keeping the frequency response plot more flat on the range 100 Hz to 1000 Hz. The level of the air resistance may be controlled by the slot depth etched on the substrate. The deeper slot, the higher the resistance.

Applicant's co-pending U.S. application Ser. No. 15/730,732 filed on Oct. 12, 2017 teaches a process of fabricating a capacitive microphone such as a MEMS microphone of the present invention. In the process, one electrically conductive layer is deposited on a removable layer, and then divided or cut into two divided layers, both of which remain in contact with the removable layer as they were. One of the two divided layers will become or include a movable or deflectable membrane/diaphragm that moves in a lateral manner relative to another layer, instead of moving toward/from another layer. The entire content of U.S. application Ser. No. 15/730,732 is incorporated herein by reference.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A MEMS device comprising a channel for air to flow through having a first internal wall and a second internal wall,
wherein air flows between the first internal wall and the second internal wall,
wherein a trench is recessed from the first internal wall,
wherein an insert is extended from the second internal wall and inserted into the trench,
wherein the insert and the trench have a first relative spatial relationship (SR1) therebetween,
wherein the spatial relationship (SR1) varies or oscillates with a frequency F1, when the MEMS device is in a working or operating state,
wherein the first internal wall is a part of a substrate; the second internal wall is a movable membrane; the trench is etched on the substrate around an edge of the moveable membrane; and the insert moves along with the movable membrane when the movable membrane moves,
wherein the insert and the trench increase the length of an air channel for the air to flow in/out of the gap between the membrane and the substrate,
wherein the MEMS device further comprises a first electrical conductor,
wherein the movable membrane constitutes at least a part of a second electrical conductor, or structurally connected to a second electrical conductor,
wherein the first electrical conductor and the second electrical conductor are configured to have a second relative spatial relationship (SR2) therebetween,
wherein a second mutual capacitance (MC2) exists between the first electrical conductor and the second electrical conductor;
wherein said relative spatial relationship (SR2) and said mutual capacitance (MC2) can both be varied by an acoustic pressure impacting upon the first electrical conductor and/or the second electrical conductor along a range of impacting directions in 3D space;
wherein said mutual capacitance (MC2) is varied the most by an acoustic pressure impacting upon the first electrical conductor and/or the second electrical conductor along one direction among said range of impacting directions, said one direction being defined as the primary direction;
wherein the first electrical conductor has a first projection along said primary direction on a conceptual plane that is perpendicular to said primary direction;
wherein the second electrical conductor has a second projection along said primary direction on the conceptual plane; and
wherein the first projection and the second projection have a shortest distance Dmin therebetween, and Dmin remains greater than zero regardless of that the first electrical conductor and/or the second electrical conductor is (are) impacted by an acoustic pressure along said primary direction or not.

2. The MEMS device according to claim 1, wherein a first mutual capacitance (MC1) exists between the insert and the trench, and said first mutual capacitance (MC1) varies or oscillates with a frequency F2 when the MEMS device is in a working or operating state, and F1=F2.

3. The MEMS device according to claim 2, wherein F1 and F2 are in the range of from 20 Hz to 20,000 Hz, the range of audible frequencies for humans.

4. The MEMS device according to claim 1, which is a capacitive MEMS microphone.

5. The MEMS device according to claim 4, wherein the microphone is configured to detect sound with frequency F3, and F1=F2=F3, when the microphone is in a working or operating state.

6. The MEMS device according to claim 1, wherein the first electrical conductor and the second electrical conductor are independently of each other made of polysilicon, gold, silver, nickel, aluminum, copper, chromium, titanium, tungsten, or platinum.

7. The MEMS device according to claim 1, wherein the substrate is flat and can be viewed as said conceptual plane, and wherein the first electrical conductor and the second electrical conductor are constructed above the substrate side-by-side.

8. The MEMS device according to claim 7, wherein the first electrical conductor is fixed relative to the substrate, wherein the movable a membrane is movable relative to the substrate, and wherein said primary direction is perpendicular to the membrane plane.

9. The MEMS device according to claim 8, wherein the movable membrane is attached to the substrate via three or more suspensions such as four suspensions.

10. The MEMS device according to claim 9, wherein the suspension comprises folded and symmetrical cantilevers.

11. The MEMS device according to claim 8, wherein the first electrical conductor comprises a first set of comb fingers, wherein the movable membrane comprises a second set of comb fingers around the peripheral region of the membrane, and wherein the two sets of comb fingers are interleaved into each other.

12. The MEMS device according to claim 11, wherein the second set of comb fingers is laterally movable relative to the first set of comb fingers.

13. The MEMS device according to claim 11, wherein the first set of comb fingers and the second set of comb fingers have identical shape and dimension.

14. The MEMS device according to claim 13, wherein each comb finger has a same width measured along the primary direction, and the first set of comb fingers and the second set of comb fingers have a positional shift along the primary direction.

15. The MEMS device according to claim 8, wherein the movable membrane is square shaped.

16. The MEMS device according to claim 15, which comprises one or more of said movable membranes, such as four movable membranes arranged in a 2×2 array configuration.

17. The MEMS device according to claim 8, further comprising two or more pairs of insert and trench.

* * * * *